United States Patent
Chen et al.

(10) Patent No.: US 11,879,617 B2
(45) Date of Patent: Jan. 23, 2024

(54) LIGHT EMITTING DEVICE AND LIGHT SOURCE MODULE

(71) Applicant: LITE-ON TECHNOLOGY CORPORATION, Taipei (TW)

(72) Inventors: Shan-Hui Chen, Taoyuan (TW); Jin-Tsai Lin, Taichung (TW); Chang-Hung Hsieh, New Taipei (TW)

(73) Assignee: LITE-ON TECHNOLOGY CORPORATION, Taipei (TW)

( * ) Notice: Subject to any disclaimer, the term of this patent is extended or adjusted under 35 U.S.C. 154(b) by 118 days.

(21) Appl. No.: 17/543,737

(22) Filed: Dec. 7, 2021

(65) Prior Publication Data
US 2022/0178519 A1  Jun. 9, 2022

Related U.S. Application Data

(60) Provisional application No. 63/188,475, filed on May 14, 2021, provisional application No. 63/121,981, filed on Dec. 7, 2020.

(30) Foreign Application Priority Data

Nov. 16, 2021  (CN) .......................... 202122805925.1

(51) Int. Cl.
*F21V 19/00* (2006.01)
*H01L 25/075* (2006.01)
(Continued)

(52) U.S. Cl.
CPC ...... *F21V 19/0025* (2013.01); *H01L 25/0753* (2013.01); *H01L 33/50* (2013.01);
(Continued)

(58) Field of Classification Search
CPC . F21V 19/0025; H01L 25/0753; H01L 33/50; H01L 33/58; H01L 33/60; H01L 33/62
See application file for complete search history.

(56) References Cited

U.S. PATENT DOCUMENTS 8,299,473 B1 * 10/2012 D'Evelyn ............... H01L 33/44
257/79
10,107,461 B2 * 10/2018 Lin ........................... F21K 9/90
(Continued)

FOREIGN PATENT DOCUMENTS

CN          106058015 A  * 10/2016    ....... G02F 1/133602

*Primary Examiner* — Mary Ellen Bowman
(74) *Attorney, Agent, or Firm* — Li & Cai Intellectual Property Office

(57) ABSTRACT

A light emitting device and a light source module are provided. The light emitting device includes a base, a conductive unit, a light unit, and a package. The base includes a first substrate and n through holes, and the through holes pass through the first substrate. The conductive unit includes m conductors that are separate from each other, and the conductors pass through the first substrate. The light unit is electrically connected to the conductors. The package includes a first package body surrounding the light unit and a second package body covering the light unit and the first package body. The first package body and the second package body have different optical properties. Furthermore, m and n are integers greater than or equal to 2, and m is greater than or equal to n.

18 Claims, 18 Drawing Sheets

(51) Int. Cl.
*H01L 33/62* (2010.01)
*H01L 33/58* (2010.01)
*H01L 33/60* (2010.01)
*H01L 33/50* (2010.01)

(52) U.S. Cl.
CPC .............. *H01L 33/58* (2013.01); *H01L 33/60* (2013.01); *H01L 33/62* (2013.01)

(56) References Cited

U.S. PATENT DOCUMENTS

| 2005/0218421 | A1* | 10/2005 | Andrews | H01L 33/58 |
| | | | | 257/E33.059 |
| 2014/0264403 | A1* | 9/2014 | Chu | H01L 25/50 |
| | | | | 438/33 |

* cited by examiner

LIGHT EMITTING DEVICE AND LIGHT SOURCE MODULE

CROSS-REFERENCE TO RELATED PATENT APPLICATION

This application claims priority to the U.S. Provisional Patent Application Ser. Nos. 63/121,981 filed on Dec. 7, 2020 and 63/188,475 filed on May 14, 2021, and to China Patent Application No. 202122805925.1 filed on Nov. 16, 2021 in People's Republic of China, which applications are incorporated herein by reference in its entirety.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a light emitting device and a light source module, and more particularly to a light emitting device and a light source module in which light emitting efficiency can be improved.

BACKGROUND OF THE DISCLOSURE

The Light Emitting Diode (LED) has the advantages of small size, high luminous efficiency, environmental protection, low energy consumption, and long production life, and is widely used in various fields. With increasing requirements of LED applications, a design with four white walls surrounding an encapsulate has been applied in conventional packaging of LED. However, such a design not only limits light emitting efficiency of LED, but also restricts an overall size of LED packaging structure, which in turn affects an application thereof in the development of miniaturized end product.

Therefore, how to improve a structural design to overcome the above issues has become one of the important issues to be addressed in the related field.

SUMMARY OF THE DISCLOSURE

In response to the above-referenced technical inadequacy the present disclosure provides a light emitting device and a light source module.

In one aspect, the present disclosure provides a light emitting device which includes a base, a conductive unit, a light unit, and a package. The base at least includes a first substrate and n through holes, and each of the n through holes passes through the first substrate. The conductive unit includes m conductors that are separate from each other, and each of the m conductors passes through the first substrate. Each of the m conductors includes a chip bonding pad, a solder pad, and a first connection. The chip bonding pad is disposed on a top surface of the base, the solder pad is exposed from a bottom surface of the base, and the first connection is connected between the chip bonding pad and the solder pad. A part of the first connection is arranged in the through hole. The light unit is correspondingly and electrically connected to the m conductors. The package includes a first package body surrounding the light unit and a second package body covering the light unit and the first package body. The first package body and the second package body have different optical properties. Furthermore, m and n are integers greater than or equal to 2, and m is greater than or equal to n.

In another aspect, the present disclosure provides a light emitting device, which includes a base, a conductive unit, a light unit, and a package. The base at least includes a first substrate and n through holes, and each of the n through holes passes through the first substrate. The conductive unit includes m conductors that are separate from each other, and each of the m conductors passes through the first substrate. Each of the m conductors includes a chip bonding pad, a solder pad, and a first connection. The chip bonding pad is disposed on a top surface of the base, the solder pad is exposed from a bottom surface of the base, and the first connection is connected between the chip bonding pad and the solder pad. A part of the first connection is arranged in the through hole. The light unit is correspondingly and electrically connected to the m conductors. The light unit includes at least one chip scale packaging light emitting diode (CSP-LED). The at least one CSP-LED includes an encapsulate formed on a light emitting chip, and the encapsulate and the package have different optical properties. Furthermore, m and n are integers greater than or equal to 2, and m is greater than or equal to n.

In yet another aspect, the present disclosure provides a light source module, which includes a circuit board, at least one light emitting device as described above, and a light guide member. The at least one light emitting device is disposed on the circuit board, and is soldered to the circuit board through the first connections respectively disposed in the through holes. The light guide member is adjacent to an illuminating surface of the at least one light emitting device.

Therefore, in the light emitting device and the light source module provided by the present disclosure, by virtue of "the package including the first package body surrounding the light unit and the second package body covering the light unit and the first package body, and the first package body and the second package body having different optical properties," a size of the light emitting device can be reduced so as to achieve an effect of miniaturization, and light emitting efficiency can be effectively improved.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1A:
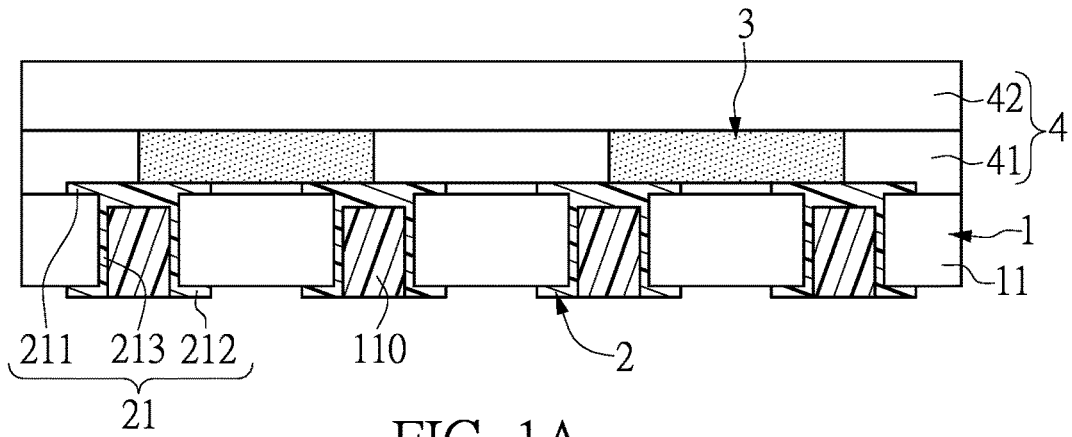
FIG. 1A and FIG. 1B are respectively a schematic cross-sectional view and a schematic perspective view of a light emitting device according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Figure 1B:
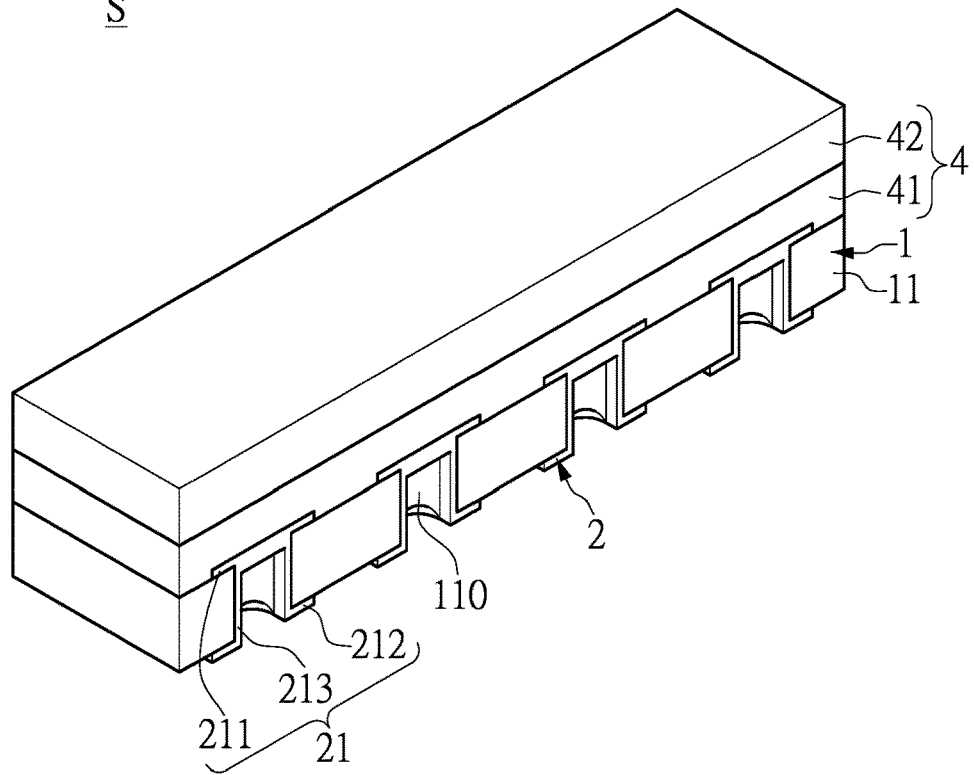

Referring to FIG. 1A and FIG. 1B, a first embodiment of the present disclosure provides a light emitting device S, which includes a base 1, a conductive unit 2, a light unit 3, and a package 4.

The base 1 can be a single-layer board or a multi-layer board structure, i.e., the base 1 at least includes a first substrate 11. In addition, the base 1 also includes at least n through holes, and each of the n through holes passes through one side the first substrate 11, where n is a positive integer and at least greater than 2. The first substrate 11 can be a flexible printed circuit (FPC), an FR4 substrate, a prepreg (PP), or glass, but is not limited thereto. It should be noted that, in the present embodiment, the base 1 is the single-layer board structure.

The conductive unit 2 includes m conductors 21 that are separate from each other, and each of the m conductors 21 passes through the base 1, where m is a positive integer and at least greater than 2. Each of the m conductors 21 includes a chip bonding pad 211, a solder pad 212, and a first connection 213. The chip bonding pad 212 is disposed on a top surface of the base 1. The solder pad 212 is exposed from a bottom surface of the base 1. The first connection 213 is connected between the chip bonding pad 211 and the solder pad 212 and passes through the base 1. A part of the first connection 213 is arranged in the through hole 110. In the present embodiment, the conductor 21 can be metal or alloy with high electrical conductivity coated on an inner semi-circular or semi-elliptical shape surface of the through hole 110, but is not limited thereto.

The light unit 3 is disposed on the chip bonding pad 211 on the top surface of the base 1, so as to be electrically connected to the conductor 21. The light unit 3 can include at least one light emitting chip. In the present embodiment, the light unit 3 includes two light emitting diodes, and the two light emitting diodes can have same wavelength or different wavelengths, which can be adjusted according to a user's requirement or an actual application. Moreover, the light unit 3 can include two flip light emitting chips that each include an N-type pad and a P-type pad, and the N-type pad and the P-type pad are disposed on a bottom surface of the flip light emitting chip and are respectively and electrically connected to two corresponding ones of the chip bonding pads 211 of the conductor 21. That is to say, each of the two flip light emitting chips is arranged between the two corresponding ones of the chip bonding pads 211 of the conductor 21.

Figure 2A:
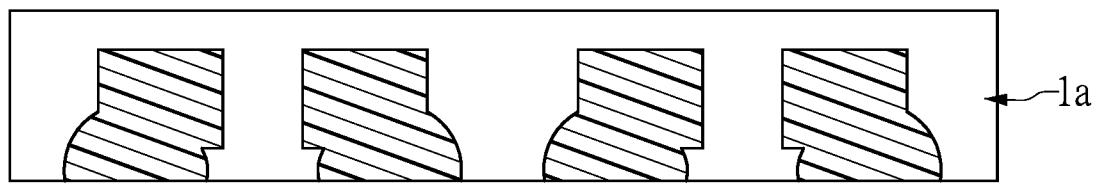
FIG. 2A and FIG. 2B respectively show a first patterned metal layer and a second patterned metal layer of a base of the light emitting device according to the first embodiment of the present disclosure.
Figure 2B:
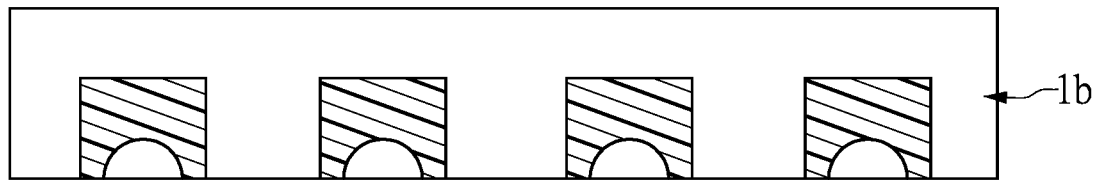
Figure 3A:
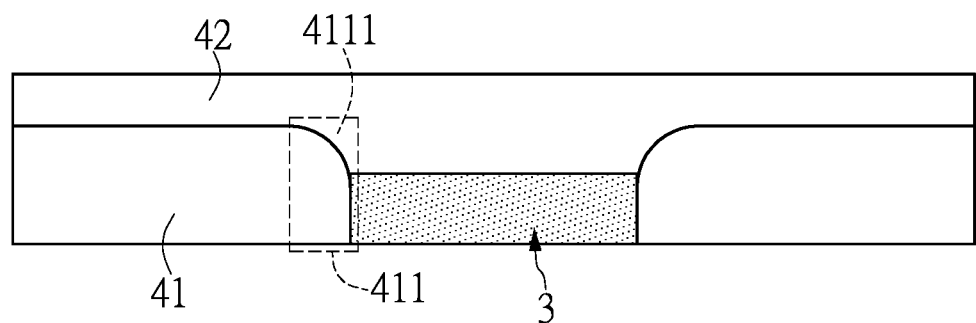
FIG. 3A, FIG. 3B, FIG. 4A, FIG. 4B, and FIG. 5 are schematic views correspondingly showing a contact part of a first package body of the light emitting device in a shape of a round corner, a bevel, and an arcuate slot according to the first embodiment of the present disclosure.
Figure 3B:
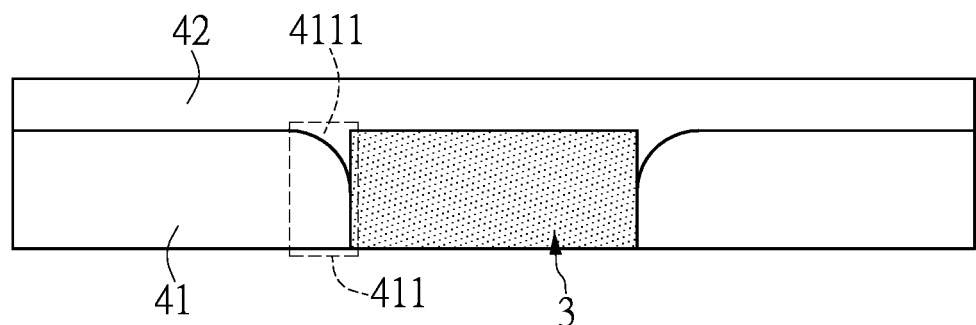
Figure 4A:
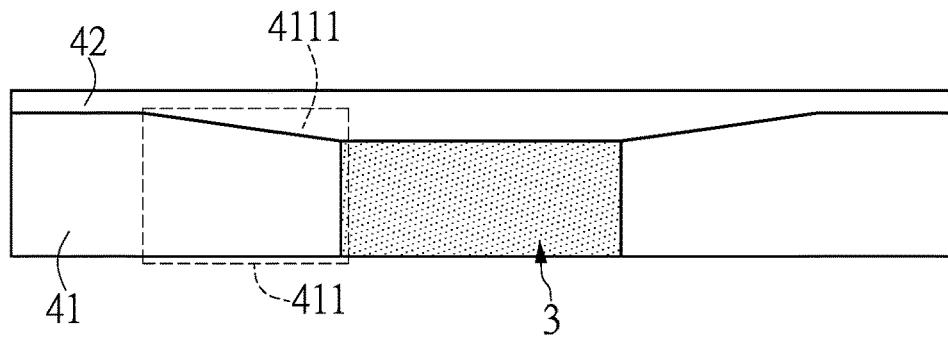
Figure 4B:
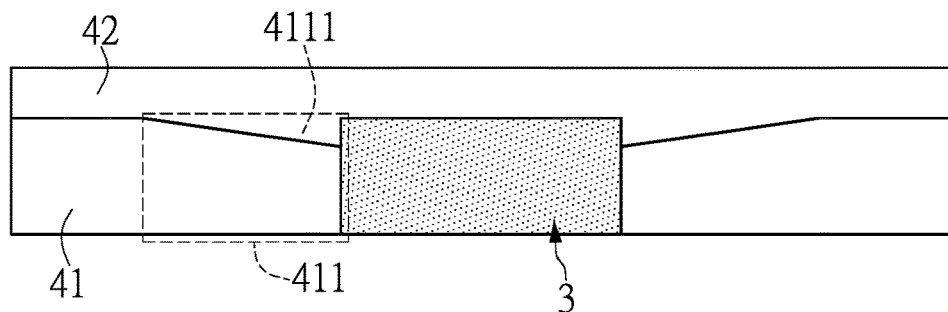

Further, as shown in FIG. 2A and FIG. 2B, since the chip bonding pad 211 and the solder pad 212 of the conductive unit 2 are correspondingly arranged in the first substrate 11, the base 1 can be regarded as including a plurality of patterned metal layers. That is, the base 1 includes a first patterned metal layer 1*a* formed on a top of the base 1 and a second patterned metal layer 1*b* formed on a bottom of the base 1, and the plurality of patterned metal layers of the base 1 can be adjusted according to the user's requirement or the actual application. For example, when the light unit 3 includes two light emitting diodes, as shown in FIG. 2A and FIG. 2B, the first patterned metal layer 1*a* includes a plurality of square portions or circular portions that each has an extension part, and the second patterned metal layer 1*b* includes a plurality of arched portions that each has a recess. In a preferred embodiment, the extension part of the first patterned metal layer 1*a* has at least one outwardly arced surface. Furthermore, any two extension parts that correspond to a same light emitting diode have individually and outwardly arced surface. When the light unit includes two light emitting diodes, a distance between any two extension parts that respectively correspond to the two light emitting diodes and are adjacent to each other is less than a distance between any two extension parts that correspond to a same light emitting diode, so that a size of the light emitting device S can be effectively reduced. The first patterned metal layer 1*a* and the second patterned metal layer 1*b* have an equal number of patterns (e.g., in the present embodiment, the number of patterns of the first patterned metal layer 1*a* and the number of patterns of the second patterned metal layer 1*b* both are four), and at least a part of the first patterned metal layer 1*a* and at least a part of the second patterned metal layer 1*b* correspond to each other, so that a conductive path is provided. It is worth mentioning that, in the present embodiment, the recess of the second patterned metal layer 1*b* is connected to one side of the base 1, and the extension part of the first patterned metal layer 1*a* also extends toward the one side of the base 1. A part of the recess of the second patterned metal layer 1*b* and a part of the extension part of the first patterned metal layer 1*a* correspond to each other. Moreover, a width of the extension part of the first patterned metal layer 1*a* is larger than a width of the square portion or the circular portion of the first patterned metal layer 1*a*. On the other hand, when viewed from the top surface of the base 1, the number of patterns of the first patterned metal layer 1*a* represents a number of the conductors 21 of the conductive unit 2. In addition, since a part of the first connection 213 is arranged in the through hole 110, the number of patterns of the second patterned metal layer 1*b* represents a number of the through holes 110. Therefore, in the present embodiment, the number of the conductors 21 is equal to the number of the through holes 110, i.e., m is equal to n.

The package 4 includes a first package body 41 and a second package body 42. The first package body 41 surrounds the light unit 3 and covers a part of the chip bonding pad 211 of the conductor 21 that is exposed, and the second package body 42 covers the light unit 3 and the first package body 41. Further, the first package body 41 and the second package body 42 each can be a colloid, and can have different optical properties. For example, but not limited to, the first package body 41 is optically opaque, and the second package body 42 is optically translucent. Alternatively, the first package body 41 is optically translucent, and the second package body 42 is optically opaque. More specifically, when the first package body 41 includes a reflective material (or a light-absorbing material), the second package body 42 includes a translucent material. Alternatively, when the first package body 41 includes the translucent material, the second package body 42 includes the reflective material (or the light-absorbing material). Moreover, the reflective material can be silicon oxide, titanium oxide, or a combination thereof, and the translucent material can be transparent resin, a phosphor, semitransparent resin, etc. In a preferred embodiment, the first package body 41 includes the reflective material such as silicon oxide, titanium oxide, or the combination thereof, and the second package body 42 includes the translucent material such as the transparent resin, the phosphor, the semitransparent resin, etc. It should be noted that, the first package body 41 and the second package body 42 can be disposed by known techniques, which are not reiterated herein.

Further, in the present embodiment, a maximum thickness of the first package body 41 is greater than or equal to a height of the light unit 3, i.e., when the first package body 41 surrounds the light unit 3, a top surface of the first package body 41 is higher than a top surface of the light unit 3, so that the first package body 41 can be completely adjacent to a periphery of the light unit 3. In addition, a ratio of a thickness of the second package body 42 to the thickness of the first package body 41 can be adjusted to between 0.5 and 2, so that light emitting efficiency of the light unit 3 can be effectively improved through an arrangement of the first package body 41 and the second package body 42. Moreover, a surface of the first package body 41 preferably can be a roughened structure, such that total reflection of incident light can be increased, thereby further enhancing the light emitting efficiency of the light unit 3.

Furthermore, as shown in FIG. 3A, FIG. 3B, FIG. 4A, FIG. 4B, and FIG. 5, the first package body 41 has a contact part 411, and the contact part 411 is adjacent to the light unit 3. It should be noted that, the contact part 411 has a surface 4111, and the surface 4111 can be in a shape of a round corner, a bevel, or an arcuate slot, but the surface 411 can be adjusted according to the user's requirement or the actual application. In addition, a maximum thickness of the contact part 411 is less than or equal to 1.5 times a height of the light unit 3, and a minimum thickness of the contact part 411 is greater than or equal to 0.5 times the height of the light unit 3, such that the light emitting efficiency of the light unit 3 can be effectively improved.

Figure 5:
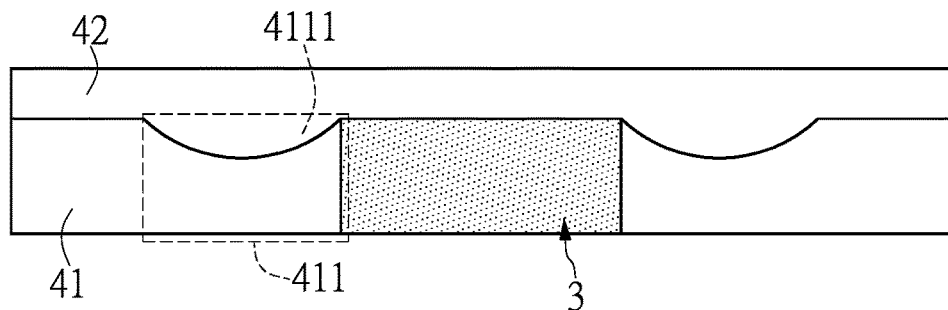
Figure 6A:
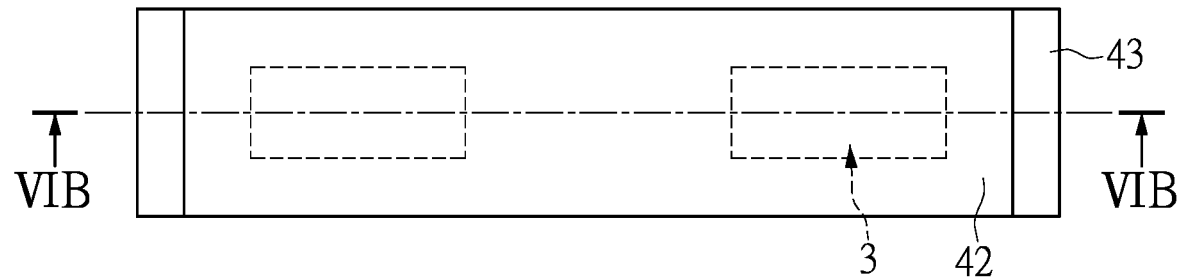
FIG. 6A is a schematic top view of the light emitting device according to the first embodiment of the present disclosure.
Figure 6B:
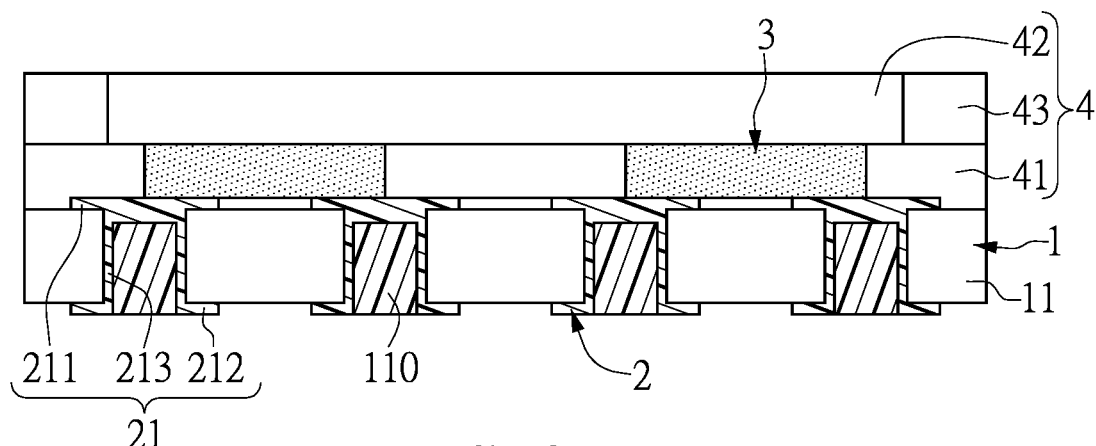
FIG. 6B is a cross-sectional view taken along line VIB-VIB of FIG. 6A.
Figure 6C:
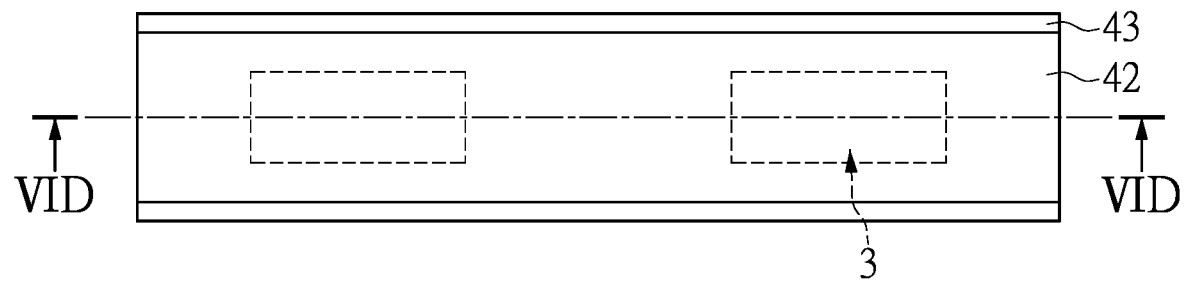
FIG. 6C is another schematic top view of the light emitting device according to the first embodiment of the present disclosure.
Figure 6D:
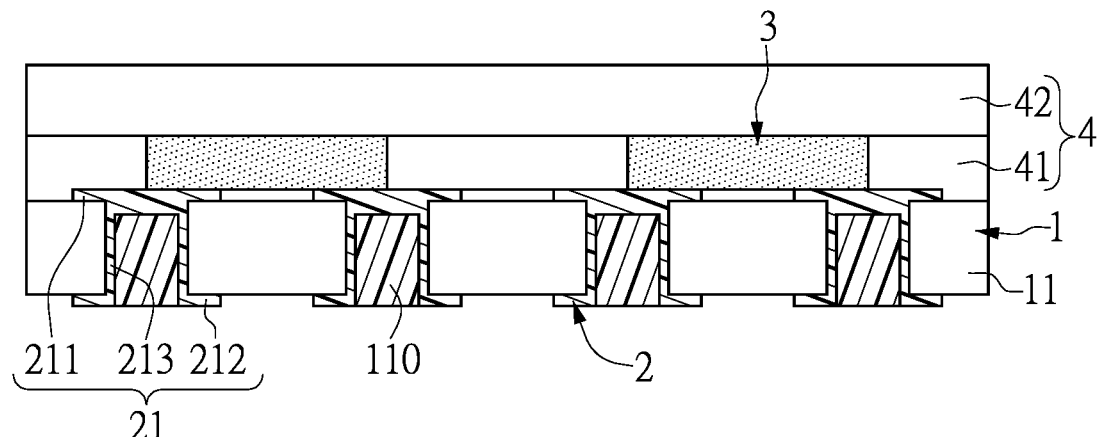
FIG. 6D is a cross-sectional view taken along line VID-VID of FIG. 6C.
Figure 6E:
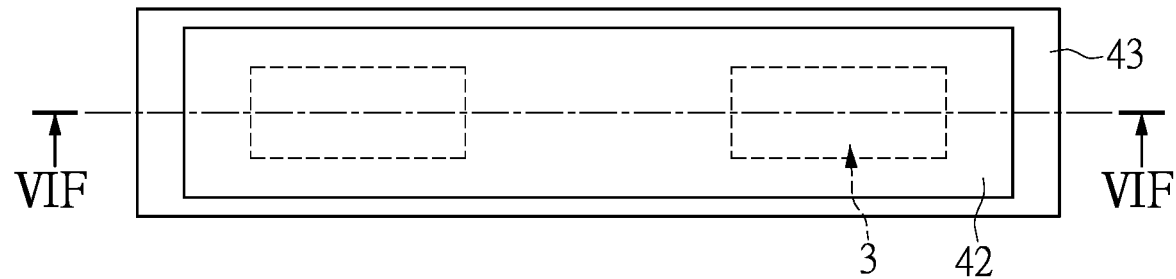
FIG. 6E is another schematic top view of the light emitting device according to the first embodiment of the present disclosure.
Figure 6F:
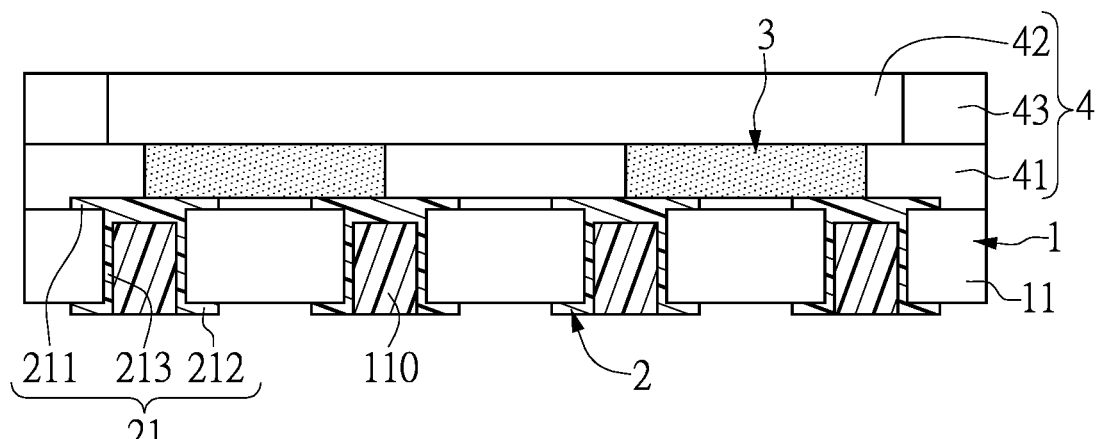
FIG. 6F is a cross-sectional view taken along line VIF-VIF of FIG. 6E.
Figure 7A:
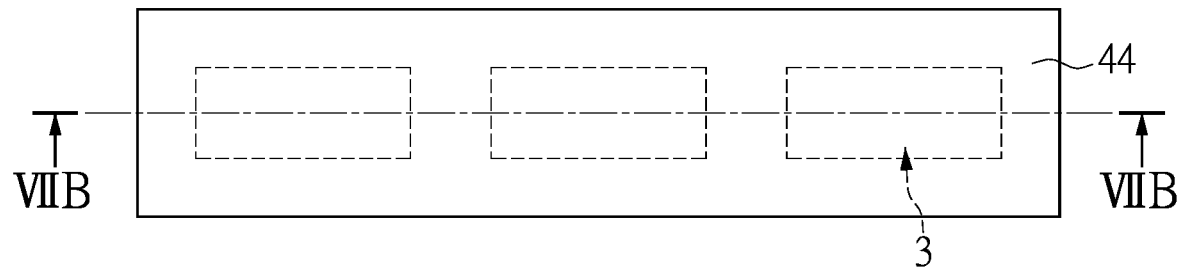
FIG. 7A is another schematic top view of the light emitting device according to the first embodiment of the present disclosure.
Figure 7B:
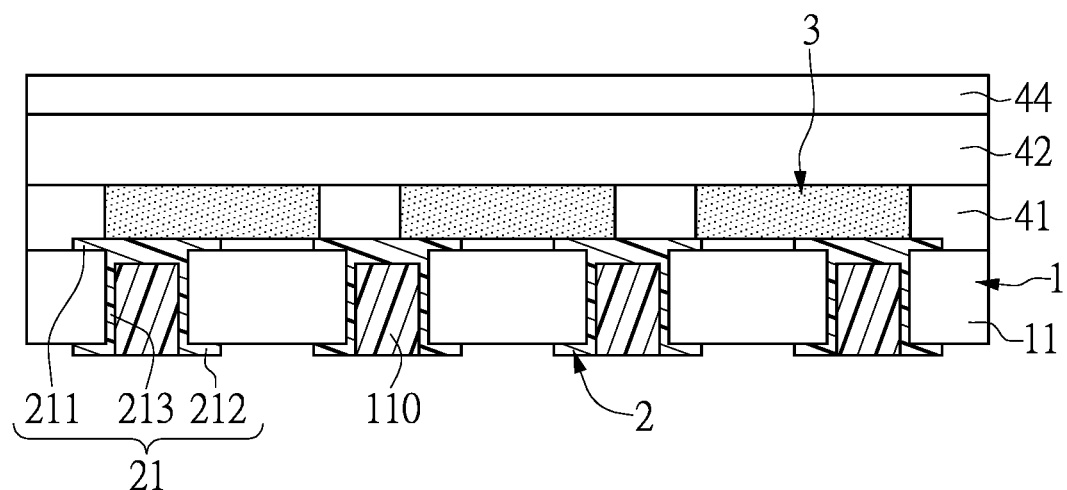
FIG. 7B is a cross-sectional view taken along line VIIB-VIIB of FIG. 7A.
Figure 7C:
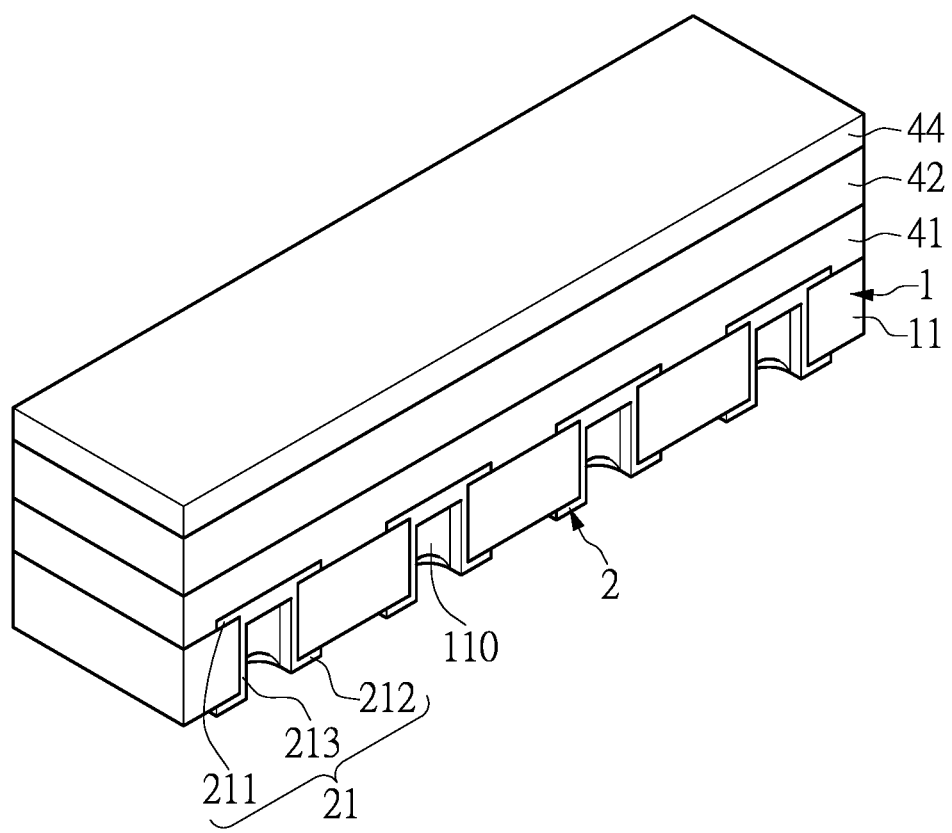
FIG. 7C is another schematic perspective view of the light emitting device according to a first embodiment of the present disclosure.

More specifically, the contact part 411 has a first terminal and a second terminal. The first terminal contacts an intersection of the top surface and a side surface of the light unit 3 or the side surface of the light unit 3, and the second terminal does not contact the light unit 3. In one embodiment, as shown in FIG. 3A, FIG. 3B, FIG. 4A, and FIG. 4B, when the surface 4111 of the contact part 411 is in the shape of the round corner or the bevel, a height from a bottom surface of the first package body 41 to the first terminal of the contact part 411 (i.e., the minimum thickness of the contact part 411) can be equal to or less than the height of the light unit 3, and a height from the bottom surface of the first package body 41 to the second terminal of the contact part 411 (i.e., the maximum thickness of the contact part 411) can be equal to or greater than the height of the light unit 3. In another embodiment, as shown in FIG. 5, when the surface 4111 of the contact part 411 is in the shape of the arcuate slot, the contact part 411 further has a recess, which is arranged between the first terminal and the second terminal, and the height from the bottom surface of the first package body 41 to the first terminal is approximately equal to the height from the bottom surface of the first package body 41 to the second terminal. That is to say, the height from the bottom surface of the first package body 41 to the first terminal (i.e., the maximum thickness of the contact part 411) can be approximately equal to the height of the light unit 3, and a height from the bottom surface of the first package body 41 to a bottom of the recess of the contact part 411 (i.e., the minimum thickness of the contact part 411) can be equal to or less than the height of the light unit 3.

Referring to FIG. 6A to FIG. 6F, the package 4 can also include at least one first reflective structure 43, which is arranged on the first package body 41 and is adjacent to the second package body 42, and a thickness of the first reflective structure 43 is equal to a thickness of the second package body 42. The first reflective structure 43 can be made of the same material as the first package body 41 or the second package body 42, but the present disclosure is not limited thereto.

In the present embodiment, the first reflective structure 43 is correspondingly adjacent to two sides of the second package body 42 that are opposite to each other. That is to say, a number of the first reflective structures 43 can be two, and the two first reflective structures 43 can be arranged adjacent to two short sides of the second package body 42 (i.e., the two first reflective structures 43 are parallel to two short sides of the base 1 that are opposite to each other) or to two long sides of the second package body 42 (i.e., the two first reflective structures 43 are parallel to two long sides of the base 1 that are opposite to each other). Alternatively, the first reflective structure 43 can also be surroundingly arranged at a periphery of the second package body 42.

Referring to FIG. 7A, FIG. 7B, FIG. 7C, FIG. 8A, and FIG. 8B, in the present embodiment, the light unit 3 includes three light emitting diodes, and light emitted by the three light emitting diodes can have same wavelength or different wavelengths, which can be adjusted according to the user's requirement or the actual application. For example, the three light emitting diodes can respectively emit red light, green light, and blue light, and the three light of different colors emitted by the three light emitting diodes can be mixed evenly so as to produce color light or white light on demand, but the present disclosure is not limited thereto. The package 4 can also include a third package body 44, which is arranged on the second package body 42. That is to say, the third package body 44, the second package body 42, and the first package body 41 can be a top-down stacked structure. It should be noted that, the third package body 44 and the second package body 42 are made of different materials. In a preferred embodiment, the second package body 42 includes the translucent material such as one of the transparent resin, the phosphor, and the semitransparent resin, and the third package body 44 includes a rest of the transparent resin, the phosphor, and the semitransparent resin. In a more preferred embodiment, the second package body 42 includes the phosphor, and the third package body 44 includes the transparent resin or the semitransparent resin. In addition, a ratio of a thickness of the third package body 44 to the thickness of the first package body 41 can be adjusted to be between 0.5 and 2, i.e., thickness of the third package body 44 and the thickness of the second package body 42 can be equal or unequal. Therefore, through an arrangement of the first package body 41, the second package body 42, and the third package body 44, the light emitting efficiency of the light unit 3 can be effectively improved.

Figure 8A:
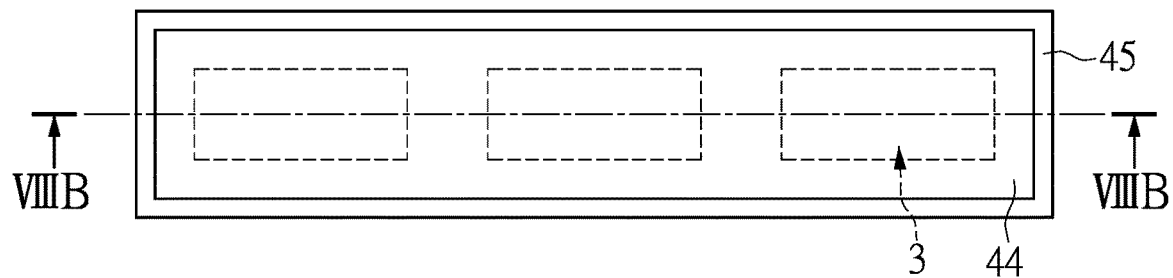
FIG. 8A is another schematic top view of the light emitting device according to the first embodiment of the present disclosure.
Figure 8B:
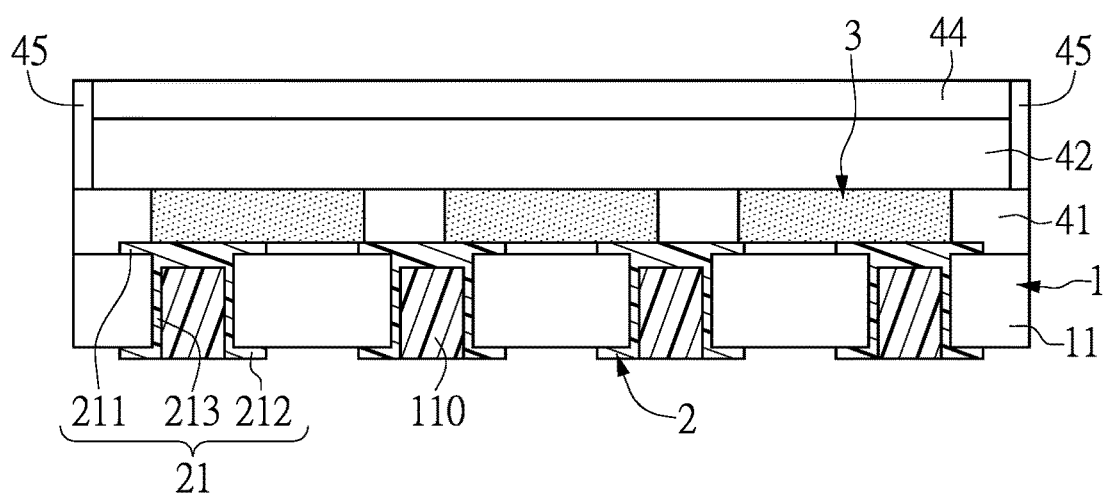
FIG. 8B is a cross-sectional view taken along line VIIIB-VIIIB of FIG. 8A.

Referring to FIG. 8A and FIG. 8B, the package 4 can also include a second reflective structure 45, which is arranged on the first package body 41, and a thickness of the second reflective structure 45 is equal to a total thickness of the second package body 42 and the third package body 44. The second reflective structure 45 can be made of the same material as the first package body 41, the second package body 42, or the third package body 44, but the present disclosure is not limited thereto.

In the present embodiment, the second reflective structure 45 is correspondingly adjacent to the same one of two sides of the second package body 42 and the third package body 44 that are opposite to each other. That is to say, a number of the second reflective structure 45 can be two, and the second reflective structure 45 can be regarded as an extension part of the first reflective structure 41 as described above that extends toward a top surface of the light emitting device S. The two second reflective structures 45 can be arranged adjacent to two short sides correspondingly of the second package body 42 and the third package body 44 (i.e., the two second reflective structures 45 are parallel to the two short sides of the base 1 that are opposite to each other) or to two long sides correspondingly of the second package body 42 and the third package body 44 (i.e., the two second reflective structures 45 are parallel to the two long sides of the base 1 that are opposite to each other). Alternatively, the second reflective structure 45 can also be surroundingly arranged at a periphery of the second package body 42 and the third package body 44.

However, the aforementioned details are disclosed for exemplary purposes only, and are not meant to limit the scope of the present disclosure.

Second Embodiment

Figure 9:
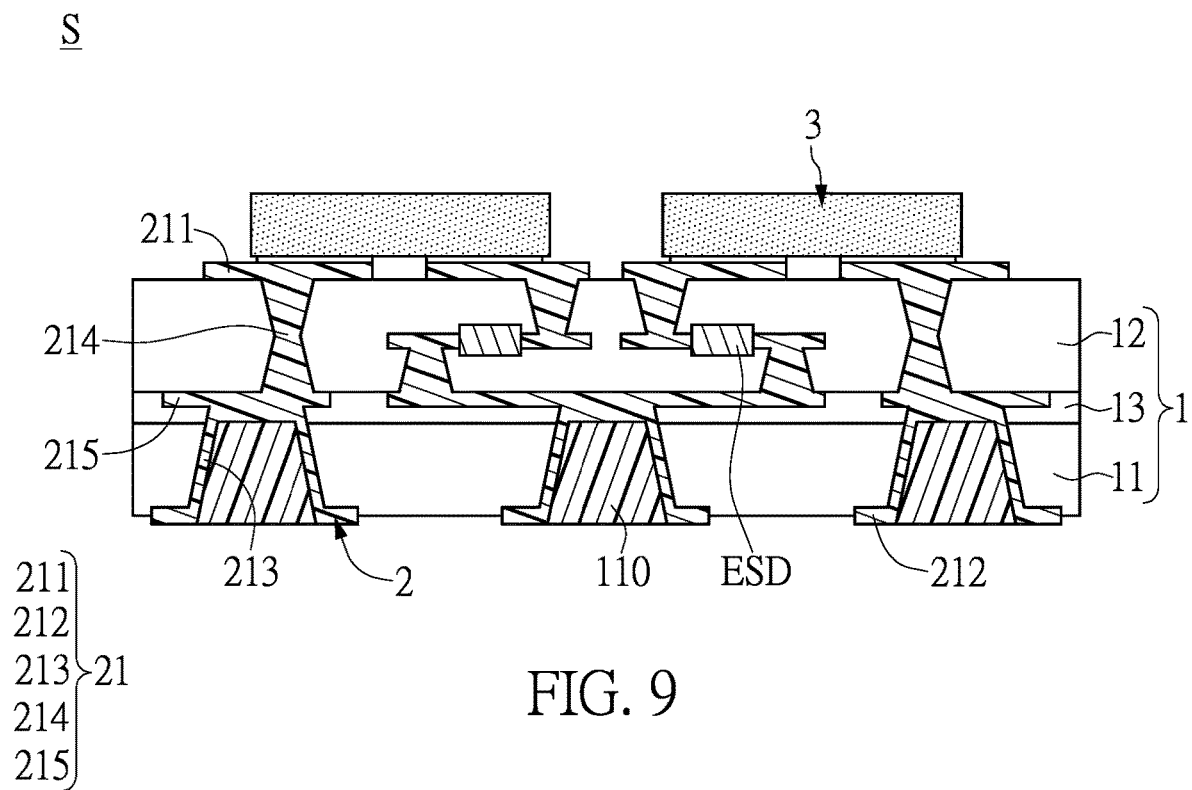
FIG. 9 is a schematic structural view of a base, a conductive unit, and a light unit of a light emitting device according to a second embodiment of the present disclosure.
Figure 10A:
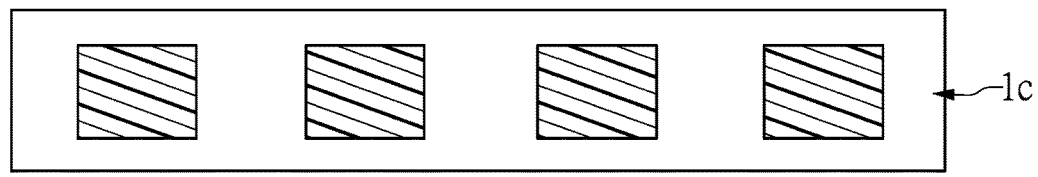
FIG. 10A, FIG. 10B, FIG. 10C, and FIG. 10D are schematic plan views correspondingly showing patterned metal layers of the base according to the second embodiment of the present disclosure.
Figure 10B:
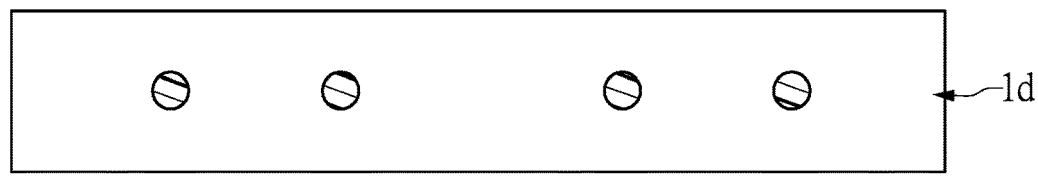
Figure 10C:
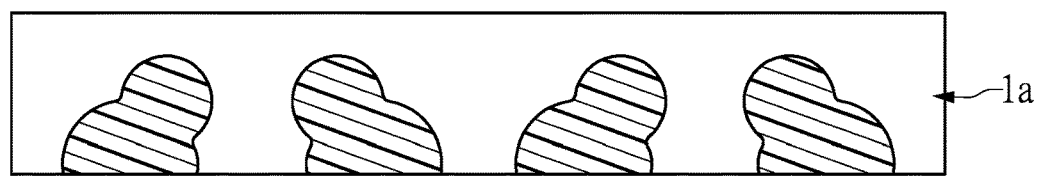
Figure 10D:
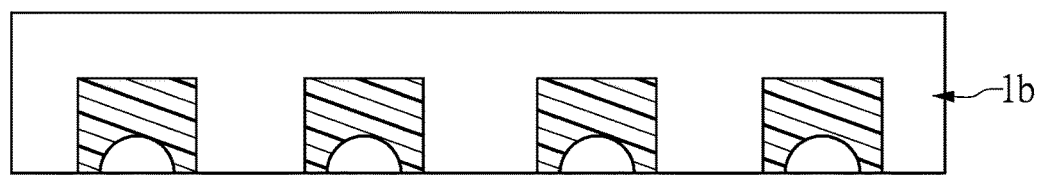
Figure 11A:
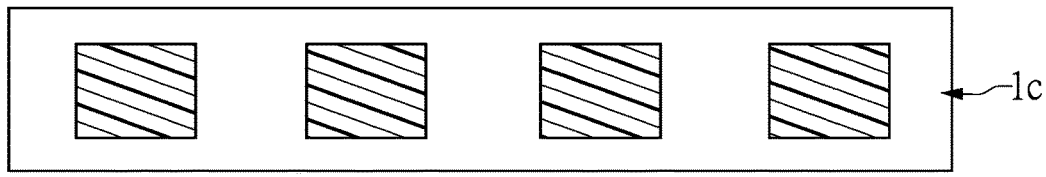
FIG. 11A, FIG. 11B, FIG. 11C, and FIG. 11D are another schematic plan views correspondingly showing the patterned metal layers of the base according to the second embodiment of the present disclosure.
Figure 11B:
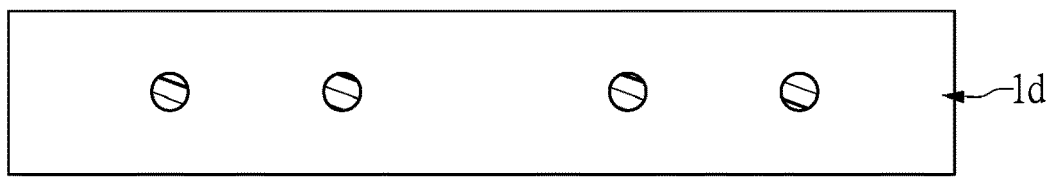
Figure 11C:
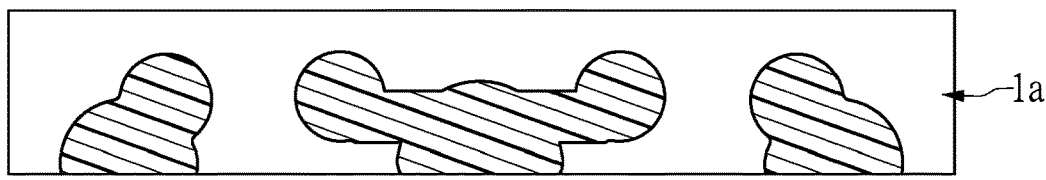
Figure 11D:
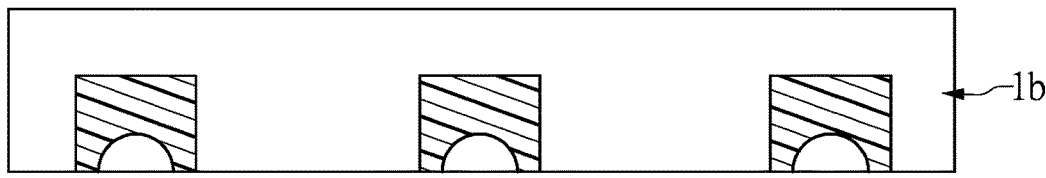

Referring to FIG. 9, a main difference between a second embodiment and the first embodiment is that, the base 1 of the second embodiment is a multi-layer structure, which includes the first substrate 11, a second substrate 12, and an adhesive layer 13 connected between the first substrate 11 and the second substrate 12. The second substrate is arranged between the first substrate 11 and the light unit 3, i.e., the second substrate 12, the adhesive layer 13, and the first substrate 11 are arranged from top to bottom. The first substrate 11 and the second substrate 12 can be made of the same material or different materials. For example, the first substrate 11 can be the FR4 substrate or the prepreg (PP), and the second substrate 12 can be the prepreg (PP) or the FR4 substrate, but is not limited thereto. In the present embodiment, the conductive unit 2 includes multiple ones of the conductors 21 each including the first connection 213 connected to the solder pad 212 on a bottom surface of the first substrate 11 and passing through the first substrate 11, and a second connection 214 connected to the chip bonding pad 211 on a top surface of the second substrate 12 and passing through the second substrate 12. In addition, the adhesive layer 13 can be made of a polymer material. The adhesive layer 13 includes an intermediate conductive part 215, which is a single-layer or a multi-layer structure arranged on a bottom surface of the second substrate 12, a top surface of the first substrate 11, or both the bottom surface of the second substrate 12 and the top surface of the first substrate 11. Each of an orthographic projection of the first connection 213 and an orthographic projection of the second connection 214 corresponds to the intermediate conductive part 215, so that the first connection 213 is electrically connected to the second connection 214 through the intermediate conductive part 215, thereby providing an electrical conductive path.

Further, as shown in FIG. 9, FIG. 10, and FIG. 11, the chip bonding pad 211, the second connection part 214, the intermediate conductive part 215, and the solder pad 212 of the conductive unit 2 are arranged between the top surface of the second substrate 12 to the bottom surface of the first substrate 11, so that the base 1 can be regarded as including a plurality of patterned metal layers. That is, the base 1 includes a top patterned metal layer 1c, a second substrate patterned metal layer 1d, a first patterned metal layer 1a, and a second patterned metal layer 1b, and the plurality of patterned metal layers of the base 1 can be adjusted according to the user's requirement or the actual application. For example, the top patterned metal layer 1c includes a plurality of square portions, the second substrate patterned metal layer 1d includes a plurality of circular portions, and the top patterned metal layer 1c and the second substrate patterned metal layer 1d have an equal number of patterns. The first patterned metal layer 1a includes a plurality of circular portions that each has an extension part, and the second patterned metal layer 1b includes a plurality of arched portions that each has an recess. The first patterned metal layer 1a and the second patterned metal layer 1b have an equal number of patterns, and at least a part of the first patterned metal layer 1a corresponds to at least a part of the second patterned metal layer 1b, so that a conductive path is provided. It is worth mentioning that, in the present embodiment, a concave side of each of the plurality of patterned metal layers that each is in the shape of the arch of the second patterned metal layer 1b is connected to one side of the first substrate 11, and the extension part of the first patterned metal layer 1a also extends toward and is connected to the one side of the first substrate 11. On the other hand, when viewed from the top surface of the base 1, the number of patterns of the top patterned metal layer 1c represents a number of the conductors 21 of the conductive unit 2. In addition, since a part of the first connection 213 is arranged in the through hole 110, the number of patterns of the second patterned metal layer 1b represents a number of the through holes 110. Therefore, the number of the conductors 21 is greater than or equal to the number of the through holes 110, i.e., m is greater than or equal to n.

Furthermore, as shown in FIG. 11A, FIG. 11B, FIG. 11C, and FIG. 11D, the numbers of patterns of the top patterned metal layers 1c and the second substrate patterned metal layer 1d are both four, and the numbers of patterns of the first patterned metal layer 1a and the second patterned metal layer 1b are both three. That is, in the base 1, one of the first connections 213 can be shared by two light emitting diodes of the light unit 3 through a manner of serial connection or a manner of parallel connection. Therefore, two N-type pads respectively disposed on the bottom surfaces of the two light emitting diodes of the light unit 3 can be arranged adjacent to each other (i.e., the electrode pads on the bottom surface of the two light emitting diodes are arranged in an order of P-type pad, N-type pad, N-type pad, and P-type pad), or two P-type pads respectively disposed on the bottom surfaces of the two light emitting diodes of the light unit 3 can be arranged adjacent to each other (i.e., the electrode pads on the bottom surface of the two light emitting diodes are arranged in an order of N-type pad, P-type pad, P-type pad, and N-type pad), such that a flexibility of an arrangement of the light unit 3 can be enhanced. Furthermore, a circuit part of the patterned metal layers can be a metalized layer or an electroplated metal layer.

Furthermore, as shown in FIG. 9, in the present embodiment, at least one function element can be disposed in the base 1. For example, in a preferred embodiment, the at least one function element can be an embedded anti-static element, so that damage to the light unit 3 caused by a voltage surge or voltage spike can be avoided. In another embodiment, the function element can be a semiconductor element, such as a Zener diode, a resistor, a capacitor, or an inductor, but is not limited thereto. In addition, in one embodiment, as shown in FIG. 9, the second substrate 12 can be a composite circuit board, that is, the function element is embedded within the second substrate 12, and the two P-type pads of the two light emitting diodes of the light unit 3 are arranged adjacent to each other. Therefore, one of the first connections 213 can be shared by the two light emitting diodes of the light unit 3, and two function elements are respectively and electrically connected to horizontal extension parts of two second connections 214 that respectively correspond to the P-type pads of the two light emitting diodes in the second substrate 12, so that the damage to the light unit 3 caused by the voltage surge or the voltage spike can be avoided, and a space used by an external circuit can be reduced.

However, the aforementioned details are disclosed for exemplary purposes only, and are not meant to limit the scope of the present disclosure.

Third Embodiment

Figure 12:
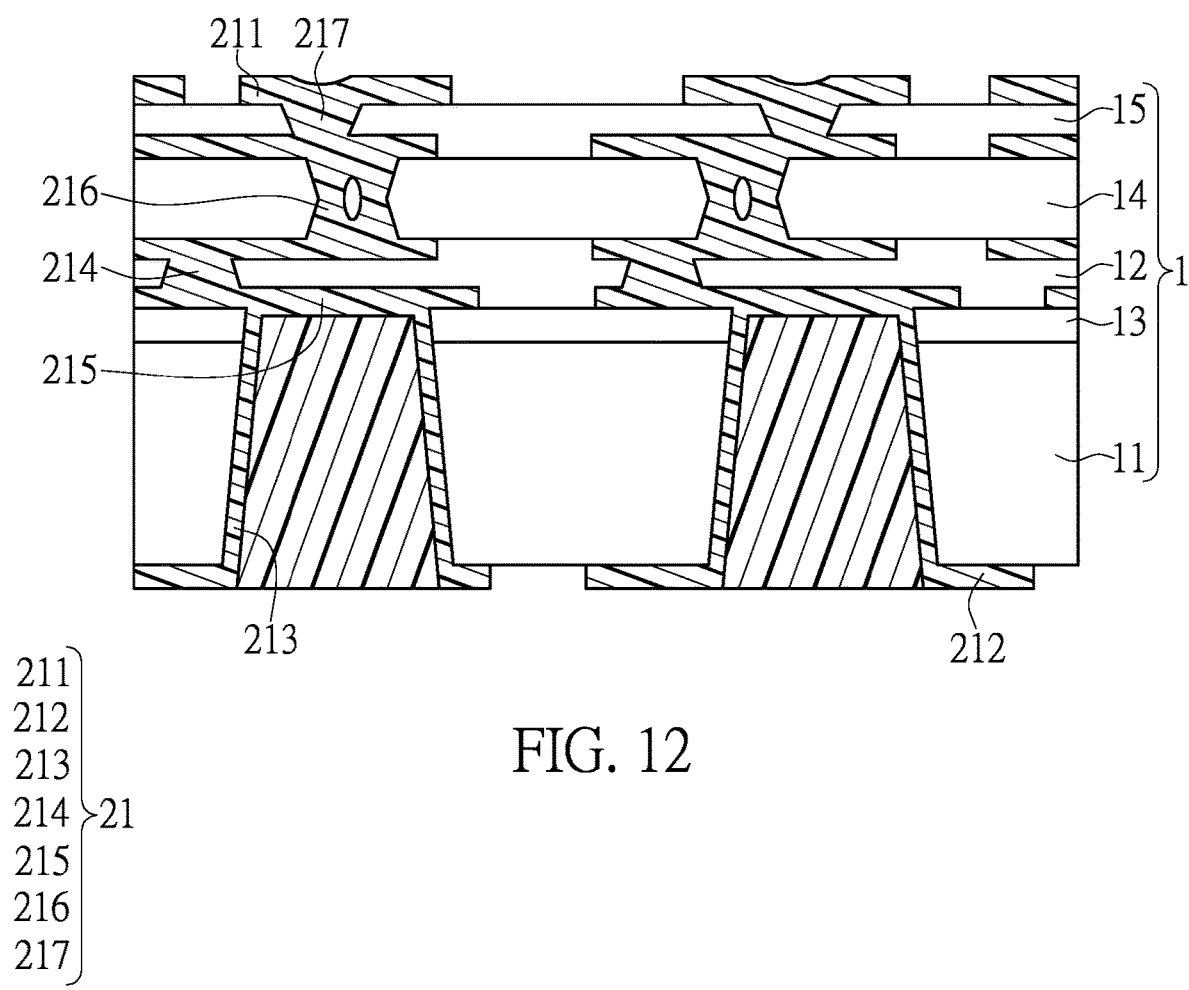
FIG. 12 is a schematic structural view of a base and a conductive unit according to a third embodiment of the present disclosure.

Referring to FIG. 12, a main difference between a third embodiment and the second embodiment is that the bases 1 of the third embodiment and the second embodiment include different numbers of substrates. The base 1 of the third embodiment is a four-layer board structure (i.e., including five layers of circuits), which includes the first substrate 11, the second substrate 12, the adhesive layer 13 connected between the first substrate 11 and the second substrate 12, a third substrate 14, and a fourth substrate 15. The fourth substrate 15, the third substrate 14, the second substrate 12, the adhesive layer 13, and the first substrate 1 are arranged from top to bottom. The first substrate 11, the second substrate 12, the third substrate 14, and the fourth substrate 15 can be made of the same material or different materials. For example, the first substrate 11, the second substrate 12, the third substrate 14, and the fourth substrate 15 can be the FR4 substrate or the prepreg (PP), but is not limited thereto. In the present embodiment, the conductive unit 2 includes the first connection 213 connected to the solder pad 212 on a bottom surface of the base 1 and passing through the first substrate 11, the second connection 214 passing through the second substrate 12, a third connection 216 passing through the third substrate 14, and a fourth connection 217 connected to the chip bonding pad 211 on the top surface of the base 1 and passing through the fourth substrate 15. In addition, the adhesive layer 13 can be made of the polymer material, and the adhesive layer 13 includes the intermediate conductive part 215. The first connection 213, the intermediate conductive part 215, the second connection 214, the third connection 216, and the fourth connection 217 correspond to each other, and the first connection 213 is electrically connected to the fourth connection 217 through the intermediate conductive part 215, the second connection 214, and the third connection 216, thereby providing an electrical conductive path.

However, the aforementioned details are disclosed for exemplary purposes only, and are not meant to limit the scope of the present disclosure.

Fourth Embodiment

Referring to FIG. 13A to FIG. 13C, FIG. 14A, and FIG. 14B, a main difference between a fourth embodiment and the first embodiment to the third embodiments is that, the light emitting chip of the light unit 3 of the fourth embodiment is a chip scale packaging (CSP) light emitting diode (LED), and particularly a white CSP light emitting diode (WCSP LED). The light unit 3 includes at least two WSCP LEDs, and the WSCP is a design with an encapsulate 46 including a wavelength converting material directly formed on a top surface and/or a side surface of the chip and with P-type and N-type electrodes arranged on a bottom surface of the chip exposed, but the present disclosure is not limited thereto.

Figure 13A:
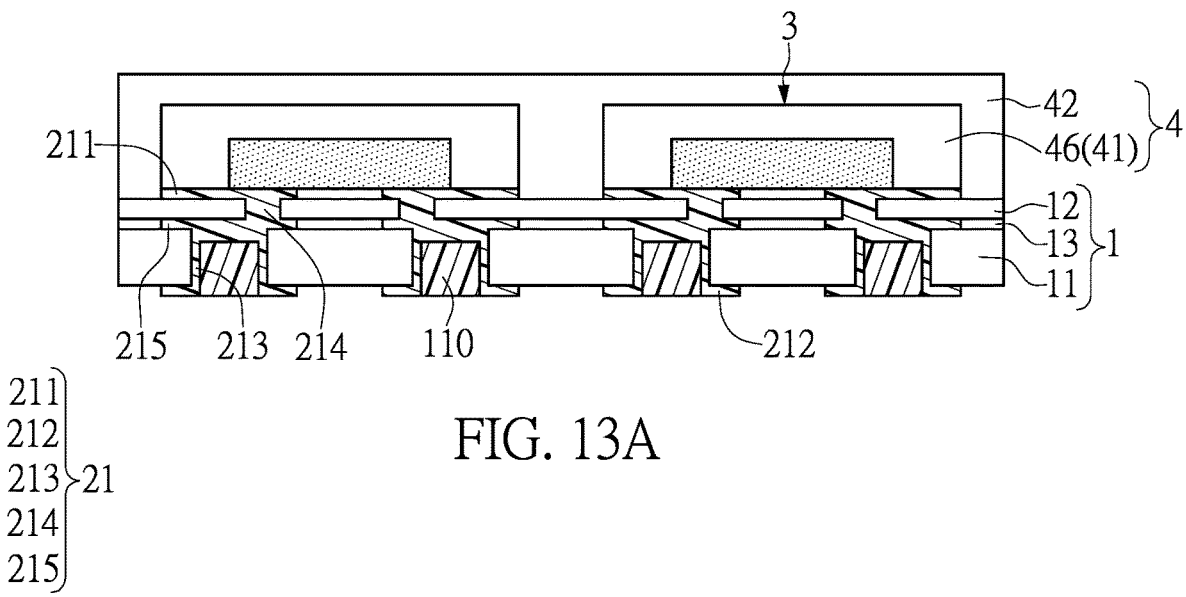
FIG. 13A is a cross-sectional view of a light emitting device according to a fourth embodiment of the present disclosure.
Figure 13B:
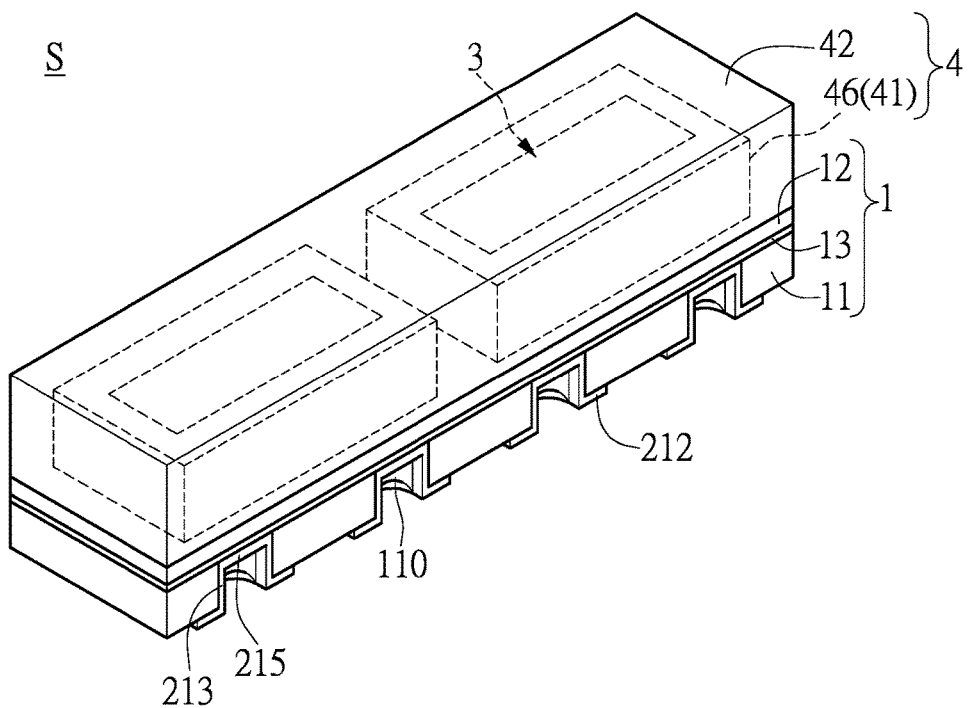
FIG. 13B is a schematic perspective view of the light emitting device of FIG. 13A.
Figure 13C:
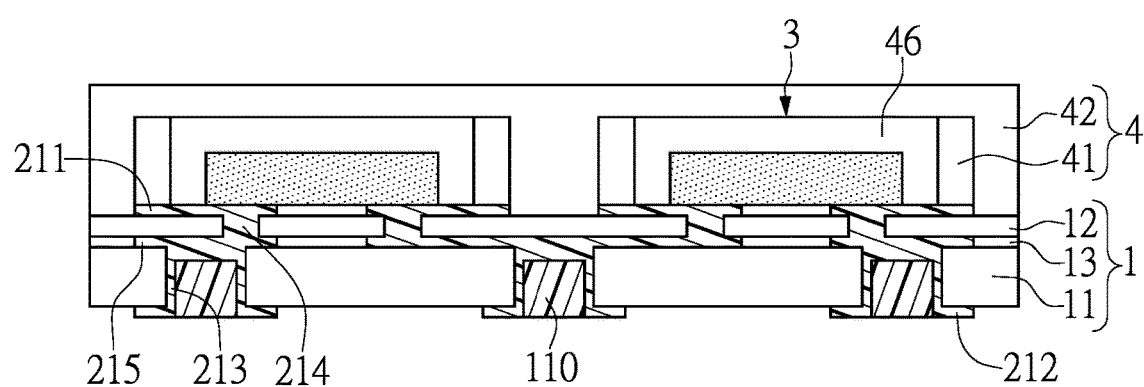
FIG. 13C is another cross-sectional view of the light emitting device according to the fourth embodiment of the present disclosure.
Figure 14A:
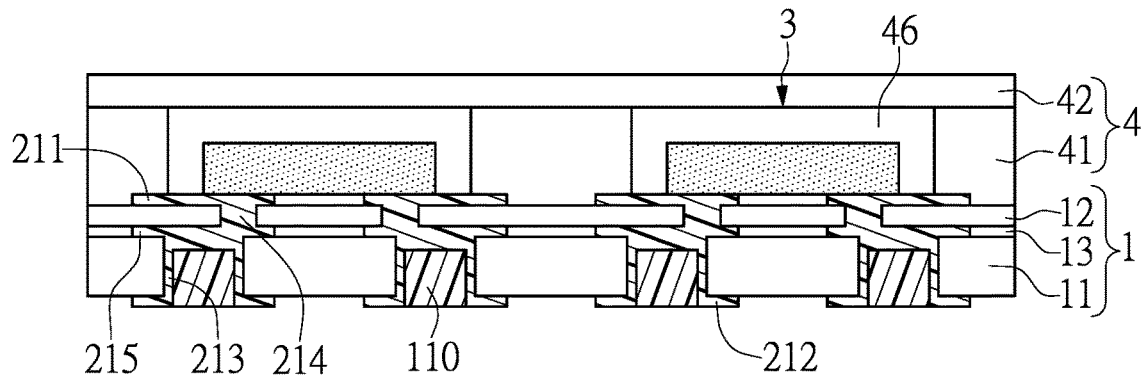
FIG. 14A is another cross-sectional view of the light emitting device according to the fourth embodiment of the present disclosure.
Figure 14B:
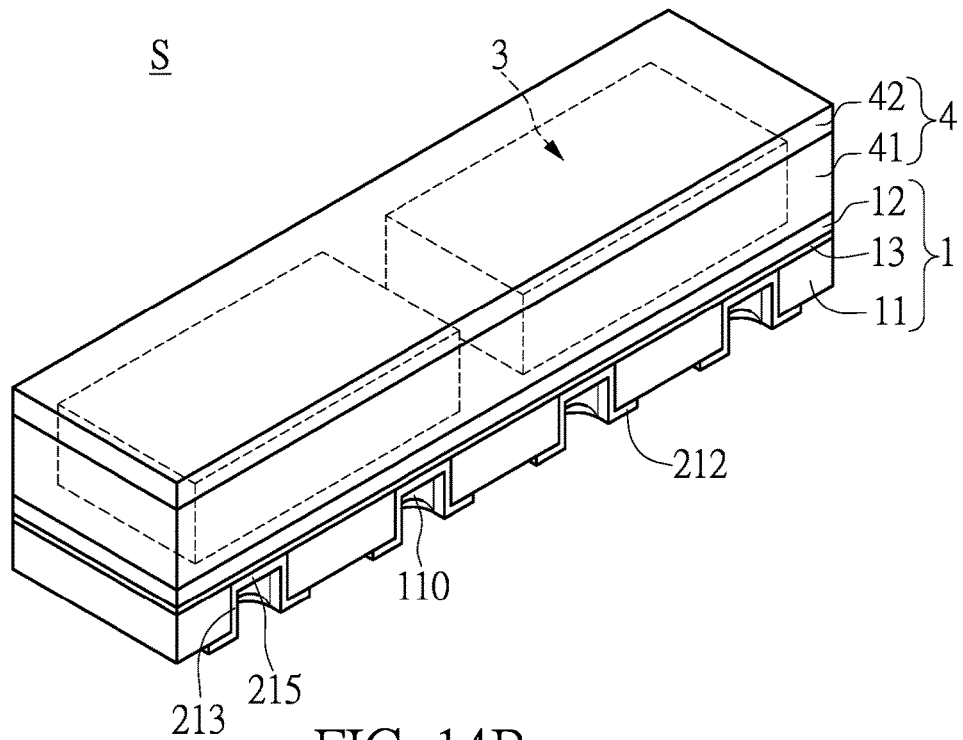
FIG. 14B is a schematic perspective view of the light emitting device of FIG. 14A.

It is worth mentioning that, as shown in FIG. 13A and FIG. 13B, the encapsulate 46 formed on the chip described above can be regarded as the first package body 41, and after the WCSP LEDs are disposed on the base 1, the second package body 41 is formed to cover the WSCP LEDs (including the light emitting chip and the encapsulate 46 (i.e., the first package body 41)). For example, the first package body 41 is the wavelength converting material, and the second package body 42 includes the translucent material or a translucent gel including a light-diffusing material. In one embodiment, as shown in FIG. 13C, the first package body 41 and the WCSP LED are integrally formed, i.e., the WCSP LED includes the light emitting chip, the encapsulate 46, and the first package body 41, and the first package body 41 surrounds the WCSP LED. Then, the WCSP LED including the first package body 41 is disposed on the base 1, and the second package body 42 is formed to cover the WCSP LED and the first package body 41. In another embodiment, as shown in FIG. 14A and FIG. 14B, the WCSP LED including the encapsulate 46 is disposed on the base 1, the first package body 41 is formed to surround the WCSP LED, and then the second package body 42 is formed to cover the WCSP LED and the first package body 41. For example, the first package body 41 can include the reflective material, and the second package body 42 can include the translucent material or further the light-diffusing material.

However, the aforementioned details are disclosed for exemplary purposes only, and are not meant to limit the scope of the present disclosure.

Fifth Embodiment

Figure 15A:
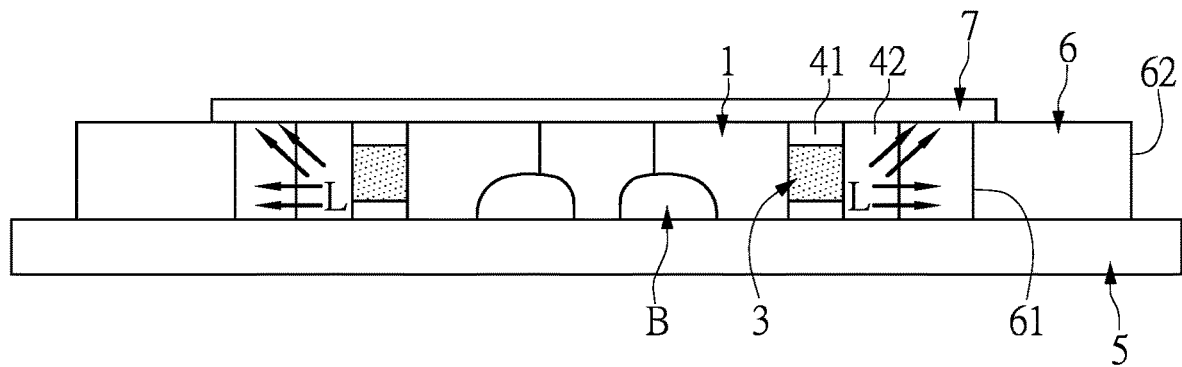
FIG. 15A and FIG. 15B are schematic views of a light source module according to a fifth embodiment of the present disclosure.
Figure 15B:
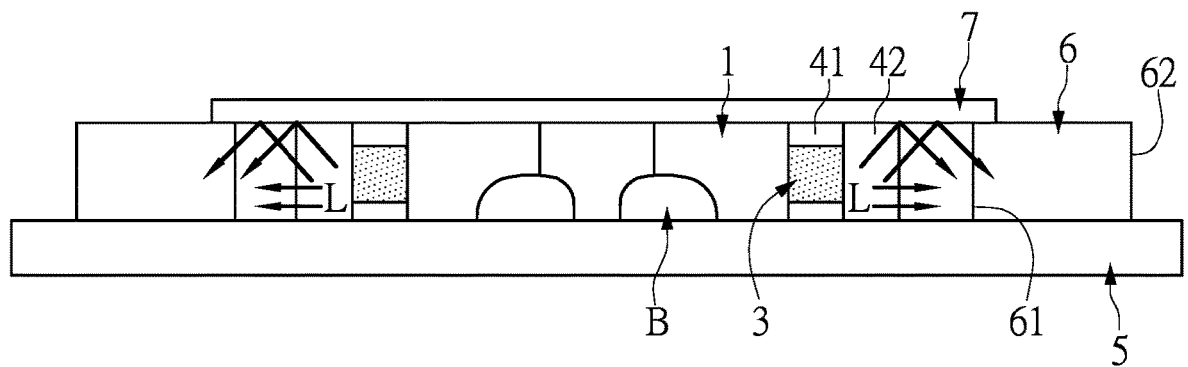

Based on the above embodiments, which are read in conjunction with FIG. 15A and FIG. 15B, a fifth embodiment of the present disclosure provides a light source module, which includes at least one light emitting device S as in the above embodiments, a circuit board 5, and a light guide member 6. The at least one light emitting device S as in the above embodiments has been described in the above embodiments, and is not reiterated herein. More specifically, in the present embodiment, the light source module is a lateral light source module. In other words, a main direction of light emitted by the light emitting device S as in the above embodiments is parallel to the circuit board 5. The circuit board 5 is perpendicular to a mounting surface, and the conductive unit 2 of the light emitting device S can be electrically connected to the circuit board 5 through a solder ball B. The circuit board 5 can be the flexible printed circuit (FPC), the FR4 substrate, the prepreg (PP), a ceramic printed circuit board (PCB), or a TEFLON® PCB, but the present disclosure is not limited thereto.

The light guide member 6 can include a transparent material or a semitransparent material, and a shape, a size, or an extension direction of the light guide member 6 can be adjusted according to the user's requirement or the actual application, but the present disclosure is not limited thereto. In a preferred embodiment, a length and a width of a cross-section of the light guide member 6 can respectively be equal to or greater than a length and a width of a cross-section of the light emitting device S, i.e., an area of the cross-section of the light guide member 6 is equal to or greater than an area of the cross-section of the light emitting device S. The light guide member 6 is adjacent to an illuminating surface of the light emitting device S, and preferably can be disposed on the circuit board 5 and be adjacent to the illuminating surface of the light emitting device S, so that light L emitted by the light emitting device S enters the light guide member 6 through a light incident surface 61 to a greater extent, and then the light L is uniformly emitted from a light exit surface 62 after being transmitted in the light guide member 6. In addition, an emission direction of the light L emitted by the light emitting device S, for example but not limited to, a direction parallel to the circuit board 5, can be adjusted by passing through the light exit surface 62 of the light guide member 6, so that most of the light L can be emitted toward a predetermined direction as desired.

As shown in FIG. 15A and FIG. 15B, in order to enhance overall light emitting efficiency, the light source module can also include at least one shading member 7. The shading member 7 can include a material having an opaque property or a shading property, for example but not limited to, a thermal curing resin, a thermoplastic resin, polyphthalamide (PPA), or a polymer resin. The reflective material, for example but not limited to, silicon oxide, titanium oxide, or a combination thereof, can be added to the resin. Furthermore, the shading member 7 is correspondingly disposed on one side of the light emitting device S that is opposite to another side of the light emitting device S through which the light emitting device S is disposed on the circuit board 5, and a part of one side of the light guide member 6 that is opposite to another side of the light guide member 6 through which the light guide member 6 is disposed on the circuit board 5. Moreover, in order to increase a contrast ratio or to enhance a light intensity in a particular direction of the light L emitted by the light emitting device S, an area of the shading member 7 is greater than an area of the one side of the light emitting device S that is opposite to the another side of the light emitting device S through which the light emitting device S is disposed on the circuit board 5, so as to absorb unwanted lateral light emitted by the light emitting device S (as shown in FIG. 15A) or to reflect lateral light (as shown in FIG. 15B).

However, the aforementioned details are disclosed for exemplary purposes only, and are not meant to limit the scope of the present disclosure.

Beneficial Effects of the Embodiments

In conclusion, one of the beneficial effects of the present disclosure is that, in the light emitting device and the light source module provided by the present disclosure, by virtue of "the package 4 including the first package body 41 surrounding the light unit 3 and the second package body 42 covering the light unit 3 and the first package body 41, and the first package body 41 and the second package body 42 having different optical properties," a size of the light emitting device can be reduced so as to achieve an effect of miniaturization, and the light emitting efficiency can be effectively improved.

Another one of the beneficial effects of the present disclosure is that, in the light emitting device and the light source module provided by the present disclosure, by virtue of "the function element being disposed in the base 1," the damage to the light unit 3 caused by the voltage surge or the voltage spike can be avoided, and the space used by the external circuit can be reduced.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A light emitting device, comprising:
   a base including a first substrate and n through holes, wherein each of the n through holes passes through the first substrate;
   a conductive unit including m conductors, wherein the m conductors are separate from each other and each of the m conductors passes through the first substrate, wherein each of the m conductors includes a chip bonding pad disposed on a top surface of the base, a solder pad exposed from a bottom surface of the base, and a first connection connected between the chip bonding pad and the solder pad, and wherein a part of the first connection is arranged in the through hole;
   a light unit correspondingly and electrically connected to the m conductors; and
   a package including a first package body and a second package body, wherein the first package body surrounds the light unit, and the second package body covers the light unit and the first package body;
   wherein the first package body and the second package body have different optical properties;
   wherein m and n are integers greater than or equal to 2, and m is greater than or equal to n;
   wherein the first package body has a contact part, and the contact part is adjacent to the light unit, and a surface of the contact part is in a shape of a round corner, a bevel, or an arcuate slot;
   wherein a maximum thickness of the contact part of the first package body is not more than 1.5 times a height of the light unit, and a minimum thickness of the contact part is not less than 0.5 times the height of the light unit.

2. The light emitting device according to claim 1, wherein a maximum thickness of the first package body is not less than a height of the light unit, and a ratio of a thickness of the second package body to the thickness of the first package body is between 0.5 and 2.

3. The light emitting device according to claim 1, wherein, when the first package body is a reflective material or a light-absorbing material, the second package body is a translucent material; wherein, when, the first package body is a translucent material, the second package body is a reflective material or a light-absorbing material.

4. The light emitting device according to claim 3, wherein the first package body or the second package body is made of transparent resin, wavelength converting resin, or semi-transparent resin.

5. The light emitting device according to claim 1, wherein the package further includes:
   at least one first reflective structure arranged on the first package body;
   wherein the second package body has two first sides that are opposite to each other, and two second sides that are opposite to each other, and the at least one first reflective structure is at least adjacent to the two first sides or the two second sides of the second package body.

6. The light emitting device according to claim 1, wherein the package further includes:
   a third package body arranged on the second package body;
   wherein the third package body and the second package body have different optical properties, and a ratio of a thickness of the third package body to a thickness of the first package body is between 0.5 and 2.

7. The light emitting device according to claim 6, wherein the package further includes:
   a second reflective structure arranged on the first package body;
   wherein the second package body has two first sides that are opposite to each other, and two second sides that are opposite to each other, the third package body has two first sides that are opposite to each other, and two second sides that are opposite to each other, and the at least one second reflective structure is at least adjacent to the two first sides of the second package body and the two first sides of the third package body, or at least adjacent to the two second sides of the second package body and the two second sides of the third package body.

8. The light emitting device according to claim 1, wherein the m conductors is arranged in a form of a first patterned metal layer and a second patterned metal layer of the first substrate; wherein the first patterned metal layer includes a plurality of square portions or circular portions that each has an extension part, and the second patterned metal layer includes a plurality of arched portions that each has a recess corresponding to the extension part of the first patterned metal layer.

9. The light emitting device according to claim 8, wherein the light unit includes two light emitting diodes, and a distance between any two extension parts that respectively correspond to the two light emitting diodes and adjacent to each other is less than a distance between any two extension parts that correspond to a same light emitting diode.

10. The light emitting device according to claim 1, wherein the base further includes:
    a second substrate; and
    an adhesive layer;
    wherein the adhesive layer is connected between the first substrate and the second substrate, and the second substrate is arranged between the first substrate and the light unit;
    wherein the conductive unit further includes:

a second connection connected to the chip bonding pad on the top surface of the base and passing through the second substrate;

wherein the adhesive layer includes an intermediate conductive part;

wherein each of an orthographic projection of the first connection and an orthographic projection of the second connection corresponds to the intermediate conductive part, and the first connection is electrically connected to the second connection through the intermediate conductive part.

11. The light emitting device according to claim 10, wherein the m conductors are arranged in a form of a top patterned metal layer, a second substrate patterned metal layer, a first patterned metal layer, and a second patterned metal layer; wherein at least a part of the top patterned metal layer, at least a part of the second substrate patterned metal layer, at least a part of the first patterned metal layer, and at least a part of the second patterned metal layer correspond to each other; wherein each of a number of patterns of the top patterned metal layer and a number of patterns of the second substrate patterned metal layer is greater than or equal to each of a number of patterns of the first patterned metal layer and a number of patterns of the second patterned metal layer.

12. The light emitting device according to claim 10, wherein the top patterned metal layer includes a plurality of square portions, the second substrate patterned metal layer includes a plurality of circular portions, the first patterned metal layer includes a plurality of circular portions or square portions, where each has an extension part, and the second patterned metal layer includes a plurality of arches where each has a recess.

13. The light emitting device according to claim 10, further comprising:

at least one semiconductor element embedded within the second substrate;

wherein the second connection has a horizontal extension part within the second substrate and electrically connected to the least one semiconductor element and the corresponding one bonding pad and the corresponding one solder pad of the m conductors.

14. The light emitting device according to claim 10, wherein the base further includes:

a third substrate; and a fourth substrate;

wherein the fourth substrate, the third substrate, the second substrate, the adhesive layer, and the first substrate are arranged from top to bottom;

wherein the conductive unit further includes:

a third connection passing through the third substrate; and a fourth connection connected to the chip bonding pad on the top surface of the base and passing through the fourth substrate;

wherein the first connection, the intermediate conductive part, the second connection, the third connection, and the fourth connection correspond to each other, and the first connection is electrically connected to the fourth connection through the intermediate conductive part, the second connection, and the third connection.

15. A light emitting device, comprising:

a base at least including a first substrate and n through holes, wherein each of the n through holes passes through the first substrate;

a conductive unit including m conductors, wherein the m conductors are separate from each other and each of the m conductors passes through the first substrate, wherein each of the m conductors includes a chip bonding pad, a solder pad, and a first connection, wherein the chip bonding pad is disposed on a top surface of the base, the solder pad is exposed from a bottom surface of the base, and the first connection is connected between the chip bonding pad and the solder pad, and wherein a part of the first connection is arranged in the through hole;

at least one chip scale packaging light emitting diode (CSP-LED) correspondingly and electrically connected to neighboring two of the m conductors; and a package covering the at least one CSP-LED;

wherein the at least one CSP-LED includes an encapsulation formed on a light emitting chip, and the encapsulation and the package have different optical properties;

wherein m and n are integers greater than or equal to 2, and m is greater than or equal to n;

wherein the encapsulation of the at least one CSP-LED is a wavelength converting material or a wavelength converting material surrounded by a first package body.

16. A light source module, comprising:

a circuit board;

at least one light emitting device according to claim 1 disposed on the circuit board, wherein the at least one light emitting device is soldered to the circuit board through the first connections respectively disposed in the through holes; and a light guide member adjacent to an illuminating surface of the at least one light emitting device.

17. The light source module according to claim 16, further comprising:

a shading member correspondingly disposed on one side of the at least one light emitting device that is opposite to another side of the at least one light emitting device through which the at least one light emitting device is disposed on the circuit board, and a part of one side of the light guide member that is opposite to another side of the light guide member through which the light guide member is disposed on the circuit board;

wherein an area of the shading member is greater than an area of the one side of the at least one light emitting device that is opposite to the another side of the at least one light emitting device through which the light emitting device is disposed on the circuit board.

18. A light emitting device, comprising:

a base including a first substrate and n through holes, wherein each of the n through holes passes through the first substrate;

a conductive unit including m conductors, wherein the m conductors are separate from each other and each of the m conductors passes through the first substrate, wherein each of the m conductors includes a chip bonding pad disposed on a top surface of the base, a solder pad exposed from a bottom surface of the base, and a first connection connected between the chip bonding pad and the solder pad, and wherein a part of the first connection is arranged in the through hole;

a light unit correspondingly and electrically connected to the m conductors; and a package including a first package body and a second package body, wherein the first package body surrounds the light unit, and the second package body covers the light unit and the first package body;

wherein the first package body and the second package body have different optical properties;

wherein m and n are integers greater than or equal to 2, and m is greater than or equal to n;

wherein, when the first package body is a reflective material or a light-absorbing material, the second package body is a translucent material;

wherein, when, the first package body is a translucent material, the second package body is a reflective material or a light-absorbing material.

\* \* \* \* \*